(12) United States Patent
Miller et al.

(10) Patent No.: US 11,221,430 B2
(45) Date of Patent: *Jan. 11, 2022

(54) MULTI-FREQUENCY LANDSCAPE ANALYSIS SYSTEM, METHOD, AND APPARATUS FOR FURNITURE SENSING

(71) Applicant: L&P PROPERTY MANAGEMENT COMPANY, South Gate, CA (US)

(72) Inventors: Eric D. Miller, Olathe, KS (US); Braden Berziel, Joplin, MO (US); Vino Gopalakrishnan, Carthage, MO (US); Jonathan Kaufmann, San Antonio, TX (US); Douglas E. Conyers, San Antonio, TX (US)

(73) Assignee: L&P Property Management Company, South Gate, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/379,083

(22) Filed: Apr. 9, 2019

(65) Prior Publication Data
US 2019/0235123 A1    Aug. 1, 2019

Related U.S. Application Data

(63) Continuation of application No. 15/420,832, filed on Jan. 31, 2017, now Pat. No. 10,281,609.

(51) Int. Cl.
*G01V 3/38* (2006.01)
*G01V 3/08* (2006.01)
(Continued)

(52) U.S. Cl.
CPC ........... *G01V 3/38* (2013.01); *G01R 27/2605* (2013.01); *G01V 3/08* (2013.01); *G01D 5/24* (2013.01); *G01R 19/2509* (2013.01)

(58) Field of Classification Search
CPC ........ G01R 27/00; G01R 27/02; G01R 27/26; G01R 27/2605; G01R 19/00;
(Continued)

(56) References Cited

U.S. PATENT DOCUMENTS

| 4,779,215 A | * | 10/1988 | Moisan | G06F 17/15 |
| | | | | 702/79 |
| 6,256,485 B1 | * | 7/2001 | Heard | H04B 1/28 |
| | | | | 455/161.1 |

(Continued)

FOREIGN PATENT DOCUMENTS

| GB | 2 538 153 A | 11/2016 |
| WO | 2011098854 A1 | 8/2011 |

OTHER PUBLICATIONS

International Preliminary Report on Patentability dated Aug. 15, 2019 in International Patent Application No. PCT/US2017/068092, 10 pages.

(Continued)

*Primary Examiner* — Hoai-An D. Nguyen
(74) *Attorney, Agent, or Firm* — Shook, Hardy & Bacon, LLP

(57) ABSTRACT

A multi-frequency sensing system for capacitive, presence-sensing technology incorporated into furniture is provided. Embodiments of the sensing system include at least one capacitive sensor coupled to a furniture item for monitoring an amount of change in capacitance with respect to at least one sensing element coupled to the furniture item. The system further includes a landscape analysis component having a plurality of frequency samplers, which generates an average capacitance change associated with the furniture item. Further, the average capacitance change may be used to determine whether the indication of average capacitance change satisfies a capacitance threshold of the furniture item.

18 Claims, 3 Drawing Sheets

(51) Int. Cl.
*G01R 27/26* (2006.01)
*G01R 19/25* (2006.01)
*G01D 5/24* (2006.01)

(58) Field of Classification Search
CPC .. G01R 19/2506; G01R 19/2509; G01D 5/24; G01D 5/2405; G01V 3/38; G01V 3/08
USPC ....... 324/600, 649, 658, 663, 664, 667, 674, 324/681, 76.11, 76.12, 76.13, 76.15, 324/76.19, 76.24, 76.38; 702/47, 52; 345/173, 174
See application file for complete search history.

(56) References Cited

U.S. PATENT DOCUMENTS

| | | | |
|---|---|---|---|
| 6,566,894 B2 * | 5/2003 | Rump | G01N 33/004 324/681 |
| 6,678,552 B2 | 1/2004 | Pearlman | |
| 8,919,211 B1 | 12/2014 | Hanson et al. | |
| 9,964,576 B2 * | 5/2018 | Hojabri | G01R 27/2605 |
| 10,120,487 B2 * | 11/2018 | Cheng | G06F 3/0416 |
| 10,386,206 B2 * | 8/2019 | Miller | G01D 5/24 |
| 2007/0040473 A1 | 2/2007 | Ballandras et al. | |
| 2010/0031745 A1 | 2/2010 | Haji-Sheikh et al. | |
| 2012/0223911 A1 | 9/2012 | Westhues | |
| 2014/0267157 A1 | 9/2014 | Dorfner | |
| 2016/0084487 A1 | 3/2016 | Chacon et al. | |
| 2016/0161623 A1 | 6/2016 | Chacon et al. | |
| 2016/0252475 A1 | 9/2016 | Rohr et al. | |
| 2018/0080954 A1 | 3/2018 | Ono et al. | |

OTHER PUBLICATIONS

Extended European Search Report and Opinion received for European Patent Application No. 17895434.3, dated Nov. 12, 2020, 10 pages.

* cited by examiner

MULTI-FREQUENCY LANDSCAPE ANALYSIS SYSTEM, METHOD, AND APPARATUS FOR FURNITURE SENSING

CROSS-REFERENCE TO RELATED APPLICATIONS

This Non-Provisional Patent Application is a continuation of U.S. patent application Ser. No. 15/420,832, filed Jan. 31, 2017, titled "Multi-Frequency Landscape Analysis System, Method, And Apparatus For Furniture Sensing," which is hereby incorporated by reference in its entirety.

STATEMENT REGARDING FEDERALLY SPONSORED RESEARCH OR DEVELOPMENT

Not applicable.

TECHNICAL FIELD

The present invention generally relates to a presence-sensing technology incorporated into furniture. More particularly, the invention relates a system for optimizing detection accuracy for a presence-detection mechanism associated with an automated furniture item.

BACKGROUND OF THE INVENTION

Accurate presence detection data is difficult to consistently collect from furniture items experiencing interruptions from one or more sources. For example, a capacitive sensing mechanism associated with a furniture item in a first environment may encounter environment changes that alter and/or mask a measured change in capacitance. The same altered capacitance detection may further translate into a measured change in capacitance that surpasses a presence-indicating threshold, falsely triggering one or more features of the furniture item due to non-triggering events in the surrounding environment. Similarly, a capacitive sensing mechanism associated with a furniture item in a second environment may experience similar "noise" interruptions in capacitance detection that are different than those experienced by the capacitive sensing mechanism of the first environment, with the impact of such "noise" generating altered capacitance detection data that initiates additional triggering events. Accordingly, a need exists for an accurate presence-sensing technology for use with automated furniture, which addresses the foregoing and other problems.

BRIEF SUMMARY OF THE INVENTION

The present invention generally relates to a system, method, and apparatus for presence detection that incorporates a capacitive component into furniture items, including automated bedding systems. It should be understood that the invention contemplates incorporating a capacitive component, such as a capacitive frame detection component, into a variety of furniture items, both bedding and otherwise, and that the invention is not limited to the specific item for which presence detection is provided. Additionally, the present invention is described as detecting/sensing presence of a person or animal in response to monitoring conducted via one or more capacitive sensing elements, such as a capacitive sensing mechanism coupled to a conductive frame of a furniture item, one or more sensors for multi-surface and/or multi-indication capacitive sensing associated with a single or multiple furniture units, segments of capacitive detection features integrated into internal or external portions of a furniture item, and/or a computing device having a processor and a memory that receives capacitive monitoring data and generates a determination of presence in response to satisfying a capacitive detection threshold.

Although a final determination of presence may be conducted using a processor and/or software associated with at least a portion of the claimed apparatus, reference to sensing and/or detection "by" the capacitive component, or a determination thereof by the control component or associated processor components, is not meant to be limiting. For example, a conductive signal detected by presence sensors may be processed in association with one or more features of a multi-frequency sensing system and may further result in a final determination of presence. In other words, a sensing element associated with a furniture item may be described as having "detected" presence, even though the eventual detection determination (e.g., upon multi-frequency sampling of capacitance change, averaging of such multi-frequency data, and analysis by a capacitance indicator) may ultimately be made in software associated with a processor. Based on a determination of presence, or lack thereof, a corresponding feature of the furniture item may be activated.

In some aspects of the invention, a multi-frequency sensing system for furniture comprises at least one capacitive sensor coupled to a furniture item, said at least one capacitive sensor monitoring an amount of change in capacitance with respect to at least one sensing element coupled to the furniture item. In further aspects, the sensing system comprises a landscape analysis component comprising a plurality of frequency samplers, wherein the landscape analysis component is configured to: (1) receive, via the at least one capacitive sensor, a first indication of capacitance change associated with a first frequency sampler of the plurality of frequency samplers; (2) receive, via the at least one capacitive sensor, a second indication of capacitance change associated with a second frequency sampler of the plurality of frequency samplers; and (3) generate an indication of average capacitance change associated with the furniture item, said average capacitance change based at least in part on the first indication and the second indication. Further, aspects of the sensing system include at least one capacitance indicator component configured to determine whether the indication of average capacitance change satisfies a capacitance threshold of the furniture item.

In another aspect, a method for detecting presence with respect to a furniture item comprises: receiving, via a primary sensing element associated with a furniture item, a plurality of capacitance change indications, each of the plurality of capacitance change indications corresponding to a frequency sampler; generating an average capacitance change indication, said average capacitance change indication comprising an average amount of change in monitored capacitance via the primary sensing element; and providing the average capacitance change indication for a threshold capacitance determination, by a computing device having a processor and a memory, of whether such average capacitance change indication satisfies or does not satisfy a threshold capacitance level associated with the furniture item In further embodiments, a landscape analysis apparatus for presence detection associated with a furniture item comprises: a first sample receiver for receiving capacitance monitoring data from a primary sensing element associated with a furniture item, said first sample receiver comprising a first capacitor measured at a first frequency; a second sample receiver for receiving capacitance monitoring data from a primary sensing element associated with the furniture item, said second sample receiver comprising a second capacitor measured at a second frequency; a third sample receiver for receiving capacitance monitoring data from a primary sensing element associated with a furniture item, said third sample receiver comprising a third capacitor measured at a third frequency; and a sample averaging component that generates an average monitored capacitance level based at least in part on 1) input received from the first sample receiver, the second sample receiver, and the third sample receiver, and 2) a baseline furniture capacitance indication associated with the furniture item, said baseline furniture capacitance indication separate from a capacitance change monitored via the primary sensing element, wherein the primary sensing element is adapted to have a voltage based on proximity of an object to at least one capacitive component of the furniture item.

Additional objects, advantages, and novel features of the invention will be set forth in part in the description which follows, and in part will become apparent to those skilled in the art upon examination of the following, or may be learned by practice of the invention.

BRIEF DESCRIPTION OF SEVERAL VIEWS OF THE DRAWINGS

The present invention is described in detail below with reference to the attached drawing figures, wherein.

DETAILED DESCRIPTION OF THE INVENTION

Figure 1:
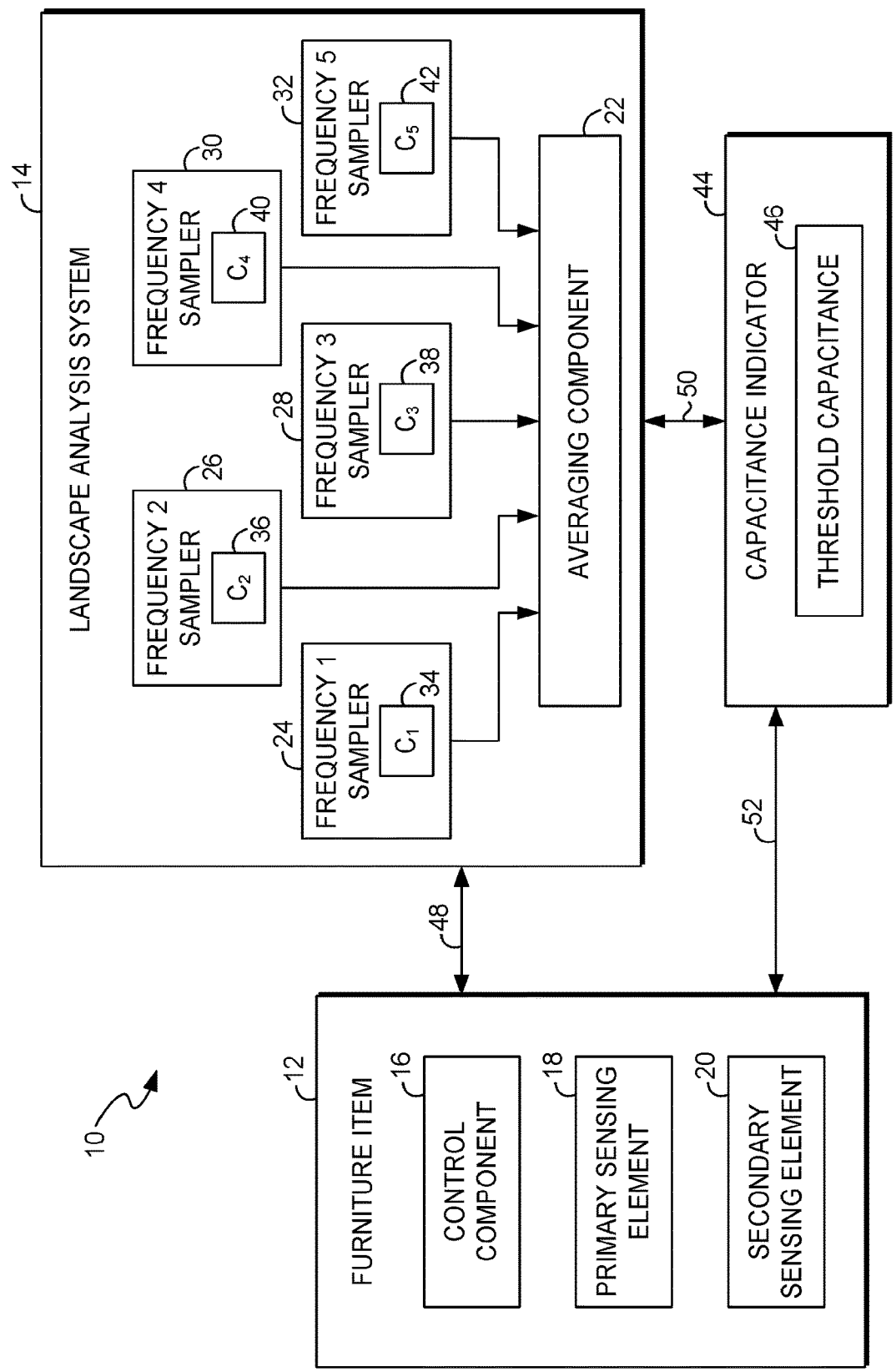
FIG. 1 is an exemplary multi-frequency, landscape analysis sensing system for furniture sensing, in accordance with embodiments of the invention.

The present invention generally relates to a system, method, and apparatus for presence detection that incorporates a capacitive component into furniture items, including automated bedding systems. In some aspects, the invention contemplates incorporating a capacitive component, such as a capacitive frame detection component, into a variety of furniture items, both bedding and otherwise, and that the invention is not limited to the specific item for which presence detection is provided. Additionally, the present invention is described as detecting/sensing presence of a person or animal in response to monitoring conducted via one or more capacitive sensing elements, such as a capacitive sensing mechanism coupled to a conductive frame of a furniture item, one or more sensors for multi-surface and/or multi-indication capacitive sensing associated with a single or multiple furniture units, segments of capacitive detection features integrated into internal or external portions of a furniture item, and/or a computing device having a processor and a memory that receives capacitive monitoring data and generates a determination of presence in response to satisfying a capacitive detection threshold.

In further aspects, the multi-frequency landscape analysis system may be configured to sample a detected level of capacitance associated with a primary sensing element associated with a furniture item, with a resulting multi-frequency sample of multiple capacitance monitoring values that may be averaged using an averaging component in a landscape analysis system. In further aspects, upon sampling across multiple frequencies to determine a capacitance change impacting a capacitive sensor of a furniture item, a cumulative survey of sequential capacitance measurements may be averaged by an averaging component to provide a more accurate detection level for analysis by a capacitance indicator having a particular threshold requirement for presence detection. In some aspects, a first noise indication might interact with one frequency sampler detecting capacitance change across a capacitor using a particular frequency. However, upon utilizing additional, alternative frequencies for multiple frequency samplers detecting noiseless capacitance changes across capacitors using different frequencies than that at which the first noise indication was detected, an averaging component of a landscape analysis system may still generate an accurate, representative capacitance change measurement in association with a sensing element of a furniture item. Utilizing such accurate, representative capacitance change measurement, a capacitance indicator may further generate a determination of presence (i.e., a determination of whether or not the averaged, representative capacitance change satisfies a particular capacitance threshold), which may then be 1) utilized by the control component of the furniture item for activating and/or deactivating additional features associated with the furniture item, 2) utilized by the primary sensing element in continued monitoring of the capacitance changes across multiple frequencies, and/or 3) utilized by a secondary sensing element in coordinated sensor activation, response, timing, triggering, and the like.

Embodiments of a multi-frequency sensing system, method, and apparatus may include one or more features for monitoring a change in capacitance associated with a furniture item, such as a capacitive sensor used to detect presence with respect to an adjustable bed frame of an automated bed. In one aspect, a multi-frequency sensing system may include at least one capacitor that resists a change in voltage applied to a capacitive component of a furniture item, such as a voltage applied to a conductive frame of an automated furniture item. In some aspects, the voltage applied to the conductive frame may consistently change, alternating between multiple different frequencies across various different measurements of capacitance. In other words, a voltage applied to a conductive frame may include multiple different voltages applied over time, in sequence or out of sequence, having varying impacts on a measurement of capacitance change. In embodiments of the invention, a multi-frequency sensing system may be configured to detect changes in capacitance with respect to a furniture item that exceed an expected capacitance level determined at a baseline value—i.e., the baseline, "known" capacitance associated with the furniture item, without additional charge applied to the capacitive component. In some aspects, the additional capacitance change beyond a baseline level of capacitance may correspond to a user touch with the capacitive component, such as a shift in detected levels of capacitance when a user contacts the capacitive component and/or portion of the conductive features of the furniture item that is coupled to the capacitive monitoring system.

In embodiments, a sampling of capacitance with respect to a conductive frame of an automated furniture item may be interrupted when sampling across one or more different frequencies. As such, environmental and/or external factors that create "noise" incidents impacting an accurate determination of capacitance change may be filtered out of a capacitance detection determination, thereby eliminating the "noise" spikes in capacitance detection that are unrelated to a user contacting a portion of the automated furniture frame, and isolating a monitoring indication of capacitance change with respect to the capacitors of the particular sensing system. In one example, multiple different samples across one or more capacitors in the landscape analysis system may be generated by applying multiple different frequency charges to the furniture frame. Based on understanding a baseline and/or calibrated level of charge associated with the furniture frame without user contact with the adjustable frame, additional changes impacting the sensing algorithm may be accurately translated as satisfying a threshold measurement of capacitance change indicating a touch with the furniture frame.

In some aspects, a sensing algorithm for averaging capacitance measurements across multiple frequencies in the landscape analysis system may be looped, into a repeated pattern of multiple different sampled frequencies. As such, at any point in time, the looped, multi-frequency data may further drive an accurate, averaged capacitance output that may be utilized to determine if the averaged capacitance satisfies a threshold. In further aspects, satisfying a threshold utilizing an averaged capacitance input may provide a more accurate indication of the actual state of the conductive frame, while filtering out one or more noise indications that would otherwise impact an un-averaged capacitance input.

In embodiments of the invention, a measured capacitance is monitored with respect to a particular sensor (i.e., a frame sensor) associated with a particular furniture item (i.e., an automated bed). In some aspects, a threshold capacitance level provides a comparison for whether or not measured capacitance indicates a change in presence. Accordingly, the threshold capacitance value may be compared against an averaged capacitance value (e.g., multiple capacitance measurements across multiple frequencies, in looped configuration), which may further provide an accurate determination of capacitance change with respect to a sensor that is then less susceptible to outside "noise" events. For example, a landscape analysis system may generate capacitance monitoring data that indicates an actual detected capacitance, without falsely triggering presence in response to an in-rush current capacitance change across a single channel. In further embodiments of the invention, environmental changes that impact the threshold over a longer duration of time may result in an adjusted threshold amount of capacitance change required to trigger an indication of presence, while system changes that impact the average capacitance measurement over a shorter duration of time, may be averaged with surrounding, additional capacitance monitoring data to adjust the detected measurement of capacitance change and provide an uninterrupted measurement of actual change in capacitance associated with the furniture frame. Further, while calibrated with a baseline indication of capacitance change associated with the automated furniture item, changes in bed position may be factored out of any triggering event at a particular bed position, where each capacitance value associated with each bed position is determined to not automatically indicate presence and/or contact with the frame, according to some embodiments.

An embodiment of a multi-frequency sensing system 10 is depicted in FIG. 1 and includes one or more features for monitoring capacitance with respect to a furniture item 10. In some aspects, the sensing system 10 comprises a furniture item 12, a landscape analysis system 14, and a capacitance indicator 44. Although depicted as three separate features within the sensing system 10, it will be understood that one or more functions, components, and/or mechanisms of the exemplary sensing system 10 may be combined into one or more other devices or components. Additionally, various features of the exemplary furniture item 12, landscape analysis system 14, and capacitance indicator 44 may be coupled directly or indirectly, through wired or wireless connections, via one or more technologies.

The exemplary furniture item 12 includes a control component 16, a primary sensing element 18, and an optional, secondary sensing element 20. In this example, reference is made to an amount of change in detected capacitance with respect to the furniture item 12 via the primary sensing element 18, while still permitting one or more secondary sensing elements 20 that may also be generating monitoring data with respect to the furniture item 12, such as a secondary sensing element 20 collecting capacitive detection data with respect to a different portion of the furniture item 12 than the primary sensing element 18.

The primary sensing element 18 may provide monitored capacitance data associated with a first component of the furniture item 12, such as capacitance monitoring data associated with a conductive frame of the furniture item 12. In some aspects, the furniture item 12 includes a conductive frame coupled to the primary sensing element 18, which is further coupled to the landscape analysis system 14. The landscape analysis system 14 is configured to receive monitored capacitance data for the primary sensing element 18 for processing by the averaging component 22. For example, the conductive component (i.e., conductive frame) of the furniture item 12 may carry a baseline level of charge associated with an environment surrounding the furniture item 12. In order to detect changes to this baseline level of charge, embodiments of the landscape analysis system 14 retrieve consecutive samples from two or more capacitors at various sampling frequencies, each sampling frequency having a unique, applied-frequency value. Upon sampling capacitance change with respect to the primary sensing element 18 at a first frequency via the first frequency sampler 24 having a first capacitor 34, one or more additional capacitors may be sampled at one or more different frequencies than the frequency utilized for sampling across first capacitor 34. For example, a capacitance change with respect to the primary sensing element 18 may then be measured at a second frequency via the second frequency sampler 26 having a second capacitor 36, and an average of the two or more indicators of capacitance change may be processed by the averaging component 22.

Additional embodiments of monitoring capacitance with respect to the same conductive component of the furniture item 12 include monitoring capacitance associated multiple frequencies, sampled in series across one or more capacitors in the example of FIG. 1. Although depicted within the landscape analysis system 14 as including a first frequency sampler 24, a second frequency sampler 26, a third frequency sampler 28, a fourth frequency sampler 30, and a fifth frequency sampler 32, it will be understood that the frequencies utilized by each sampler are distinct, according to embodiments of the invention. In one aspect, the first, second, third, fourth, and fifth frequency samplers 24, 26, 28, 30, and 32 may be a single frequency sampler component that alternates between distinct frequency values for sampling changes in capacitance via one or more capacitors of the primary sensing element 18. Accordingly, the exemplary embodiment of FIG. 1 includes multiple frequency samplers and multiple capacitors that may be combined, in one aspect, into a single frequency sampler component associated with the primary sensing element 18 that receives indications of changes in capacitance utilizing multiple different sampling frequencies, such as one or more capacitors 34 with repeated and sequential sampling across multiple frequencies.

In one example, the furniture item 12 is an automated furniture item having an automated mechanism for moving one or more features of the bed, such as a platform raising and lowering as part of an adjustable bed platform. The automated feature may be controlled by the control component 16, and associated with the primary sensing element 18, such as a capacitive sensor of the primary sensing element 18 coupled to a conductive frame under an automated bed platform. As such, capacitance data across multiple frequencies may be collected for processing by the averaging component 22 in association with the landscape analysis system 10.

In further aspects, the averaging component 22 receives monitored capacitance change data across multiple frequencies (i.e., the frequencies sampled across frequency samplers 1, 2, 3, 4, and 5) and generates an average change in capacitance at a particular timepoint. Such determination may be ongoing, with a cyclic sampling of each frequency sampler 24, 26, 28, 30, and 32 having a distinct sampling frequency within the landscape analysis system 14. Additionally, such determination by the averaging component 22 may effectively eliminate one or more interrupted signals and/or changes in capacitance across the plurality of frequency samplers. For example, an incidence of noise and/or interruption with detection may impact a single frequency sampler and capacitor, such as a noise instance impacting one of multiple frequency samplers, which may become a negligible noise changed based on processing by the averaging component 22.

In FIG. 1, the capacitance indicator 44 includes a threshold capacitance component 46 which represents at least one determination conducted by the multi-frequency sensing system 10, according to some embodiments. For example, the threshold capacitance component 46 may receive an indication of averaged capacitance change from the averaging component 22 via connection 50, which may then be used to compare to a threshold value associated with the type of sensor and/or type of furniture item being monitored. For example, the threshold capacitance component 46 may receive an indication of average capacitance change from the averaging component 22, which may then be compared against a threshold level of capacitance for determining whether the monitored capacitance associated with the primary sensing element 18 for the furniture item 12 triggers a particular capacitance indication. As such, while a single incidence of capacitance change across a single frequency may not trigger an indication of presence with respect to an occupancy sensor on a furniture frame (i.e., a primary sensing element 18 associated with a furniture item 12), the landscape analysis system 14 may monitor, in rapid succession, the capacitance measured across the first, second, third, fourth, and fifth capacitors 34, 36, 38, 40, and 42, to generate an average capacitance at the averaging component 22. Such average value may continually change over time, as the sequential and repeated sampling across multiple frequencies continues checking for future indications of change in capacitance. However, as continually monitored across connection 48 between the furniture item 12 with the primary sensing element 18, and the landscape analysis system 14, the processed average data may be sent across connection 50 as an indication of current change in capacitance, for comparison to a threshold capacitance level indicating whether or not the primary sensing element 18 has detected a particular type of capacitance change. In one example, the primary sensing element 18 is a capacitive sensing mechanism coupled to a frame of the furniture item 12 that is used to determine presence with respect to the furniture item frame, such as an articulating bed frame under an automated bed platform. Based on a determination of satisfying or not satisfying the threshold capacitance 46 level, an indication may be sent to the furniture item 12 across one or more different connections 52. In some aspects, a received indication of capacitance triggering by the furniture item 12 may activate one or more responses by the control component 16, such as deactivating an articulating motor on an automated bed platform based on a capacitance change indication of presence below the bed and/or in connection with the frame. In further aspects, one or more features of the furniture item 12 may also be triggered by an indication of capacitance from the threshold capacitance 46 component. In yet another example, a primary sensing element 18 may provide one or more additional indications to a secondary sensing element 20, where the secondary sensing element 20 may then become responsive to the threshold capacitance determination made at the capacitance indicator 44.

Figure 2:
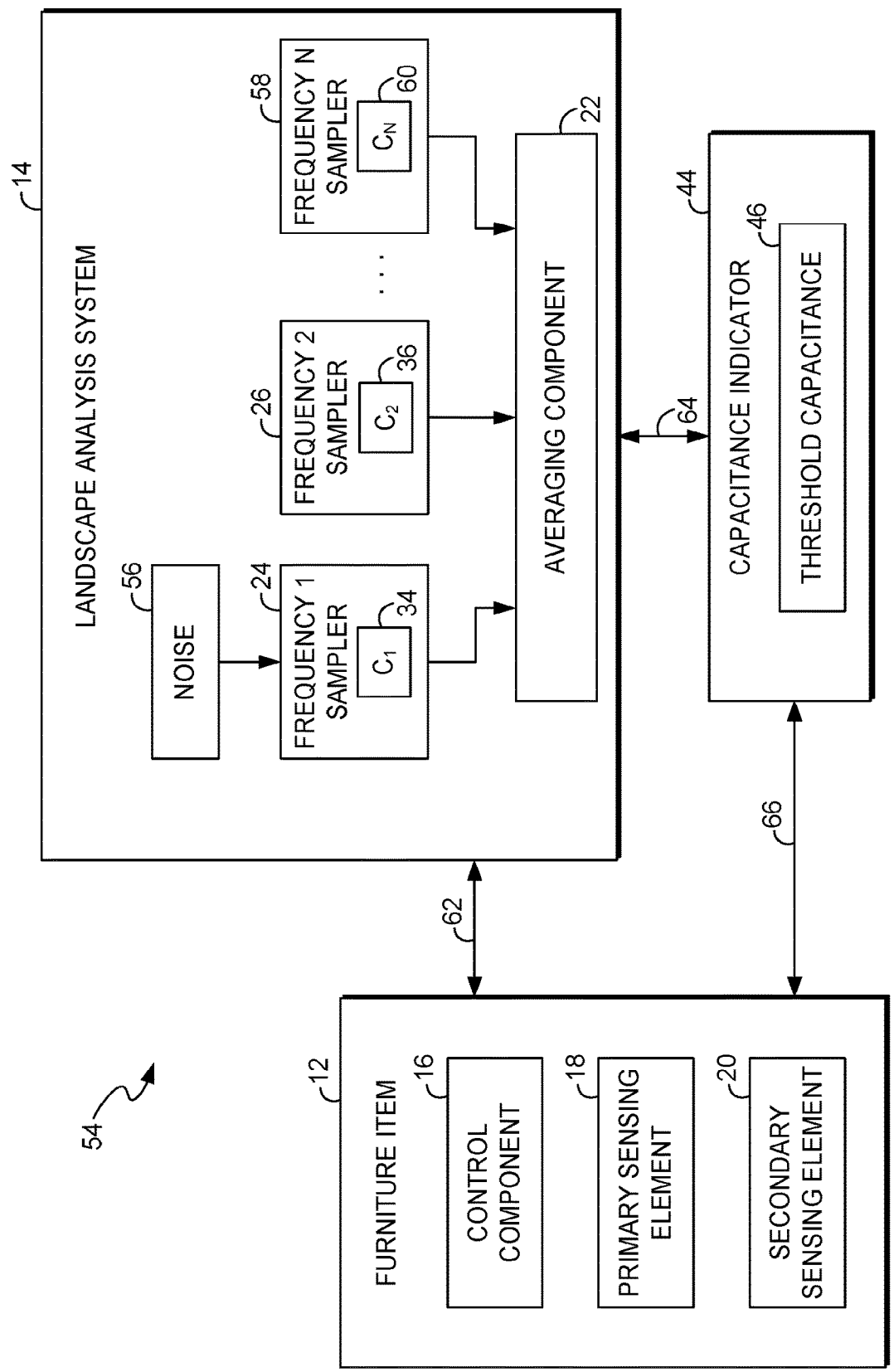
FIG. 2 is an exemplary multi-frequency, landscape analysis sensing system for furniture sensing, with a first noise indication, in accordance with embodiments of the invention.

Turning next to FIG. 2, an exemplary multi-frequency sensing system 54 includes a furniture item 12 coupled to a landscape analysis system 14 and a capacitive indicator 44 via one or more connections 62, 64, and 66 (direct, indirect, wired, wireless, etc.). In some embodiments, a noise indication 56 may be detected at the first frequency sampler 24, such that the capacitance measured across the first capacitor 34 includes an interrupted sample of capacitance change associated with the primary sensing element. In further examples, at least one noise indication 56 may be detected by one or more frequency samplers associated with a landscape analysis system 14, such as one or more changes to capacitance monitored across one or more capacitors to provide at least one interrupted sample of capacitance detection. In some aspects, a noise indication 56 may include any change in detection that interferes with a reading of capacitance at a particular frequency at a corresponding sample time, such as an amount of noise interference that is detected at a first frequency applied across the frequency sampler 24. In some aspects, based on uninterrupted presence detection across the adjacent frequency samplers (such as the second frequency sampler and any additional frequency samplers (N)), a level of change in capacitance associated with the primary sensing element 18 may be associated with an average capacitance change via averaging component 22 that samples a measured capacitance at multiple frequencies for an average capacitance indication with minimized and/or dampened interaction from one or more noise indications 56.

For example, the noise indication 56 may be a household item in any environment surrounding the furniture item 12 that impacts data collected by one or more sensors, such as the primary sensing element 18. In some aspects, at least two frequency samplers providing data to the averaging component 22 may continue sequentially monitoring capacitance with respect to the primary sensing element 18, such that an incidence of interference from the noise indication 56 may become averaged out of any determination made at the threshold capacitance component 46, thereby intercepting any "false" indication of capacitance being sent from the capacitance indicator 44 to the furniture item 12 via the connection 66. For example, the capacitance indicator 44 may receive a cumulative and averaged capacitance indication derived from a series of capacitance monitoring samples across multiple frequency samplers, having multiple capacitors, in association with a primary sensing element 18 that experiences a noise indication 56 from a running vacuum. In some aspects, the running vacuum noise indication 56 detected by the first frequency sampler 24 may provide an increased change in capacitance as detected at the first frequency applied during detection across the first capacitor 34. However, based on a cycling of sampling across the first frequency sampler 34, in addition to 1) capacitance sampling across the second frequency sampler 26, with a second capacitive sensor 36 and a second applied frequency, and 2) one or more other frequency samplers (N) 58 (i.e., a quantity of additional frequency samplers (N)) having additional capacitors (N) 60 (i.e., a quantity of additional capacitors N), the landscape analysis system 14 may compile data across multiple alternative frequencies different than the first (interrupted) frequency. In other words, the dampening and/or interfering impact of the noise indication 56 (e.g., the interfering vacuum noise across the first frequency as detected by the first frequency sampler 34) may be processed by the averaging component 22 in a series of frequency sampler data to provide a more accurate indication of capacitance change with respect to the primary sensing element 18, and in turn generate a more accurate determination of associated threshold capacitance 46.

Figure 3:
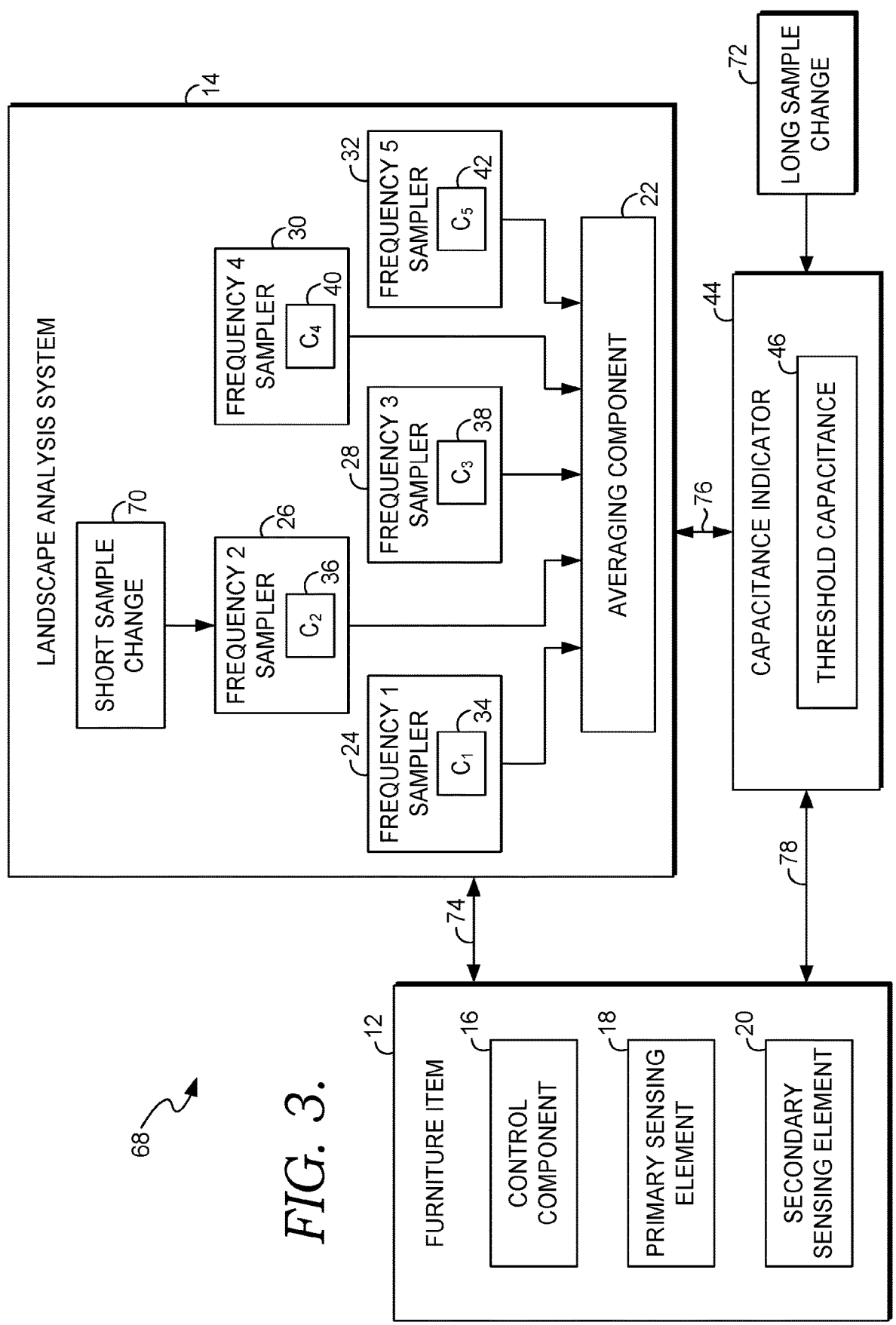
FIG. 3 is an exemplary multi-frequency, landscape analysis sensing system for furniture sensing, with short and long noise indications, in accordance with embodiments of the invention.

In some aspects, as shown in the exemplary multi-frequency sampling system 68 in FIG. 3, an indication of noise interrupting a capacitance monitoring sample taken at a particular frequency may be impacted by one or more external factors that are detected at a particular frequency for a particular duration. For example, a short sample change 70 may interfere with the second frequency sampler 26, which is monitoring capacitance via primary sensing element 18 using a second frequency across second capacitor 36. In this example, the short sample change 70 may indicate a short triggering time, such as an interruption in capacitance detection that increases a change in capacitance over a period from 1-10 milliseconds, with enough magnitude to satisfy the threshold capacitance 46. In other words, in an example of a household appliance that interferes with the second frequency sampler to offset the accurate presence reading via primary sensing element 18, such interference is offset by multiple, additional frequency sampler sensing as compiled by the averaging component 22 for processing by the capacitance indicator 44.

In some aspects, the short sample change 70 may relate to short-term interferences, or changes in capacitance that become detectable after a short amount of time, such as a spiked change in capacitance that multiplies the measured capacitance level (e.g., a spike in capacitance across the second frequency associated with a kitchen appliance, thereby impacting the output of the second frequency sampler 2, while not impacting the first frequency across the first frequency sampler 24, the third frequency across the third frequency sampler 28, the fourth frequency across the fourth frequency sampler 30, and the fifth frequency across the fifth frequency sampler 32. Accordingly, the furniture item 12 may be exposed to at least one short sample change 70 impacting the data collected via primary sensing element 18, with impact across the second frequency sampler 26, and without impacting the capacitance monitored via frequencies across first, third, fourth, and fifth frequency samplers 24, 28, 30, and 32. In some aspects, the furniture item 12, landscape analysis system 14, and capacitance indicator 44 may communicate via one or more connection 74, 76, and 78, utilizing sampled capacitance associated with the primary sensing element 18 to determine one or more responses by the control component 16.

With continued reference to FIG. 3, a long sample change 72 may also impact the capacitance detection and/or determination of the multi-frequency sensing system 68. As shown in this example, the long sample change 72 directly impacts the threshold capacitance 46 of the capacitance indicator 44, such as a change in the environment that is longer in duration, occurring over a longer period of time so as to not satisfy the threshold after a single measurement. In some aspects, the long sample change 72 may include an environment change that occurs over time, such as a shift in humidity, that indirectly impacts the primary sensing element 18 accuracy based on shifting a level of detected capacitance upward until the overall capacitance in the system triggers the threshold capacitance 46, requiring an upward adjustment in the threshold level. In some aspects, while a short sample change 70 is shown as impacting a frequency sampler of the landscape analysis system, and is offset via the averaging component 22, at least one feature of the capacitance indicator 44 may be used to offset the long sample change 72 impact with respect to a shifting change in threshold capacitance. Accordingly, the landscape analysis system may compensate for individual noise indications that alter a multi-sample, multi-frequency analysis that would generate a false indication of presence (i.e., falsely satisfying the threshold capacitance 46 that indicates the primary sensing element 18 has been triggered). In one aspect, the landscape analysis system 14 may compensate for short sample changes 70 via the averaging component 22 and subsequent determination by the capacitance indicator 44. In further aspects, the landscape analysis system may provide an averaged capacitance measurement via averaging component 22, which may be subsequently compared to an adjusted detection threshold as calibrated in response to the long sample change 72, and corresponding adjustment of the threshold capacitance 46. As such, with either short sample changes 70 or long sample changes 72, aspects of the multi-frequency sensing system 68 may be configured to adjust for capacitance detection sensitivity at both the frequency data collection level and threshold comparison level. Additional embodiments may also include a corresponding reaction from the control component 16 of the furniture item 12, such as a deactivating of a particular component, such as a moveable frame of the furniture item 12. In further embodiments, an adjustment for capacitance detection sensitivity at one or both of the frequency data collection level and the threshold comparison level may impact one or more additional activation, sensitivity, and/or threshold configurations associated with the secondary sensing element 20, or one or more additional components of the multi-frequency sensing system 68.

From the foregoing, it will be seen that this invention is one well adapted to attain all the ends and objects hereinabove set forth together with other advantages, which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative and not in a limiting sense.

What is claimed is:

1. A multi-frequency sensing system for a furniture item, the multi-frequency sensing system comprising:
   the furniture item;
   at least one capacitiv sensor that receives, from a sensing element associated with the furniture item, indications of capacitance with respect to the furniture item;
   a landscape analysis system comprising a plurality of frequency samplers, wherein the landscape analysis system determines a change in the indications of capacitance via the plurality of frequency samplers, wherein the plurality of frequency samplers comprises:
   a first frequency sampler using a first sampling frequency that is associated with a first indication of capacitance, and
   a second frequency sampler using a second sampling frequency that is associated with a second indication of capacitance, wherein the second sampling frequency is distinct from the first sampling frequency; and
   a capacitance indicator that determines an indication of presence with respect to the furniture item based on both the change in the first indication of capacitance and the change in the second indication of capacitance, wherein the capacitance indicator compares a value calculated from both the change in the first indication of capacitance and the change in the second indication of capacitance to a capacitance threshold of the furniture item.

2. The multi-frequency sensing system of claim 1, wherein the first indication of capacitance is associated with a first capacitor and the second indication of capacitance is associated with a second capacitor.

3. The multi-frequency sensing system of claim 1, wherein the change in the indications of capacitance is determined based on a calibrated baseline.

4. The multi-frequency sensing system of claim 1, wherein the capacitance threshold of the furniture item is adjusted based on an environment of the furniture item.

5. The multi-frequency sensing system of claim 1, wherein the landscape analysis system generates a combined capacitance change for the first and second sampling frequencies by compiling the indications of capacitance associated with the first sampling frequency and the second sampling frequency.

6. The multi-frequency sensing system of claim 5, wherein the capacitance indicator compares the combined capacitance change with a capacitance threshold of the furniture item.

7. A method for detecting presence with respect to a furniture item, the method comprising:
   receiving indications of capacitance with respect to the furniture item;
   determining changes in the indications of capacitance, the indications of capacitance being associated with a plurality of distinct sampling frequencies comprising:
   a first sampling frequency that is associated with a first indication of capacitance, and
   a second sampling frequency that is associated with a second indication of capacitance, wherein the second sampling frequency is distinct from the first sampling frequency; and
   determining an indication of presence with respect to the furniture item based on a value calculated from both the change in the first indication of capacitance and the change in the second indication of capacitance.

8. The method of claim 7, wherein the changes in the indications of capacitance are determined based on at least one calibrated baseline.

9. The method of claim 7, further comprising: generating a combined capacitance change for the plurality of distinct sampling frequencies by compiling the indications of capacitance associated with the first sampling frequency and the second sampling frequency.

10. The method of claim 7, further comprising comparing the value calculated from both the change in the first indication of capacitance and the change in the second indication of capacitance to a capacitance threshold of the furniture item.

11. The method of claim 10, wherein the capacitance threshold of the furniture item is adjusted based on an environment of the furniture item.

12. The method of claim 9, further comprising: comparing combined capacitance change for the plurality of distinct sampling frequencies with a capacitance threshold of the furniture item.

13. One or more non-transitory computer-storage media having computer-executable instructions embodied thereon that, when executed by a processor, perform a method of detecting presence with respect to a furniture item, the method comprising:
   receiving indications of capacitance with respect to the furniture item;
   determining changes in the indications of capacitance, the indications of capacitance being associated with a plurality of distinct sampling frequencies comprising:
   a first sampling frequency that is associated with a first indication of capacitance, and
   a second sampling frequency that is associated with a second indication of capacitance, wherein the second sampling frequency is distinct from the first sampling frequency; and
   determining an indication of presence with respect to the furniture item based on a value calculated from both the change in the first indication of capacitance and the change in the second indication of capacitance.

14. The one or more non-transitory computer-storage media of claim 13, the method further comprising: generating a combined capacitance change for the plurality of distinct sampling frequencies by compiling the indications of capacitance associated with the first sampling frequency and the second sampling frequency.

15. The one or more non-transitory computer-storage media of claim 14, the method further comprising: comparing the combined capacitance change for the plurality of distinct sampling frequencies with a capacitance threshold of the furniture item.

16. The one or more non-transitory computer-storage media of claim 13, the method further comprising: comparing the value calculated from both the change in the first indication of capacitance and the change in the second indication of capacitance to a capacitance threshold of the furniture item.

17. The one or more non-transitory computer-storage media of claim 16, wherein the capacitance threshold of the furniture item is adjusted based on an environment of the furniture item.

18. The one or more non-transitory computer-storage media of claim 13, wherein the changes in the indications of capacitance are determined based on at least one calibrated baseline.

* * * * *